(12) United States Patent
Skotnicki et al.

(10) Patent No.: US 6,534,811 B2
(45) Date of Patent: Mar. 18, 2003

(54) DRAM CELL WITH HIGH INTEGRATION DENSITY

(75) Inventors: Thomas Skotnicki, Crolles (FR); Stéphane Monfray, Grenoble (FR); Catherine Mallardeau, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/042,506

(22) Filed: Jan. 9, 2002

(65) Prior Publication Data

US 2002/0090781 A1 Jul. 11, 2002

(30) Foreign Application Priority Data

Jan. 11, 2001 (FR) .............................. 01 00295

(51) Int. Cl.$^7$ ............................................. H01L 27/108
(52) U.S. Cl. ....................................... 257/296; 257/301
(58) Field of Search ................................. 257/296, 301, 257/302, 303, 304, 305, 309; 438/243, 386

(56) References Cited

U.S. PATENT DOCUMENTS

| | | | | | |
|---|---|---|---|---|---|
| 5,662,768 A | * | 9/1997 | Rostoker | ...................... | 216/39 |
| 5,943,581 A | * | 8/1999 | Lu et al. | ...................... | 438/386 |
| 6,204,119 B1 | * | 3/2001 | Lange et al. | ................ | 438/254 |
| 6,204,141 B1 | * | 3/2001 | Lou | ........................... | 438/386 |

* cited by examiner

Primary Examiner—Tuan H. Nguyen
(74) Attorney, Agent, or Firm—Allen, Dyer, Doppelt, Milbrath & Gilchrist, P.A.; Lisa K. Jorgenson

(57) ABSTRACT

A process for making a DRAM-type cell includes growing layers of silicon germanium and layers of silicon, by epitaxy from a silicon substrate; superposing a first layer of N+ doped silicon and a second layer of P doped silicon; and forming a transistor on the silicon substrate. The method also includes etching a trench in the extension of the transistor to provide an access to the silicon germanium layers relative to the silicon layers over a pre-set depth to form lateral cavities, and forming a capacitor in the trench and in the lateral cavities.

10 Claims, 6 Drawing Sheets

DRAM CELL WITH HIGH INTEGRATION DENSITY

FIELD OF THE INVENTION

The present invention concerns a process for manufacturing a Dynamic Random Access Memory (DRAM) cell, with a view to improve its integration capacitance. The invention is therefore, more particularly, related to the field of DRAM cell architecture.

BACKGROUND OF THE INVENTION

Each DRAM cell comprises a capacitor of a MOS-type transistor structure and is affected by leakages like any capacitor. Thus, the information contained in each cell containing a binary "1" must be periodically regenerated so it does not disappear.

At the present time, DRAM cells are subject to a greater desire for improved integration. Attempts are thereby being made to increase the number of memory cells manufactured per surface unit in the substrate of a monolithic integrated circuit. In the desire for higher integration density, two prevailing DRAM cell architectures may be distinguished.

First, the most common architecture for manufacturers of semiconductors concerns cells where the capacitor is buried under the transistor. The capacitor is therefore initially formed in a trench in the semiconductor and the transistor is manufactured after the capacitor. The desire to improve integration density is leading to the use of smaller and smaller components, which means that the capacitor aspect ratio must be increased to retain a constant surface and thus a capacitor of equivalent charge.

Indeed, the quantity of charge stored in a capacitor is proportionate to the capacitor surface. So, in the prior art "in-trench" architecture where the capacitor is buried under the transistor, the only way to increase the capacitor surface, and therefore the quantity of stored charges, is to increase the depth of the capacitor. Capacitor surface gain is therefore achieved in the trench.

The main drawback of this architecture is the capacitor aspect ratio of the memory cell structure when the objective is to increase integration density and when, consequently, smaller and smaller components are used. Particularly, in the case of high density integration, where transistors in 0.1 $\mu$m (micrometer) technology are used, the trench depths necessary to retain total equivalent capacitance of 30 fF (femto-Farrad), i.e. the capacitance necessary for the cell to operate correctly, exceeds ten micrometers. This gives a ratio of 100 relative to the transistor size.

Such a trench depth creates a real technological barrier. Uniform etching over several micrometers is indeed extremely difficult to achieve. The complexity of the technological stages to be implemented is therefore a hinderance to improving integration density in architecture where the capacitor is buried.

Moreover, the type of architecture where the capacitor is buried under the transistor does not allow high permittivity dielectric materials, such as tantalum pentoxide $Ta_2O_5$ for example, to be integrated into the capacitor. Indeed, since the capacitor is formed before the transistor is manufactured, the anneal stage, which allows the impurities of the source and drain zones of the transistor to be activated, causes severe degradation of the dielectric properties of the tantalum pentoxide. The thermal balance of the transistor therefore prevents the integration of high permittivity dielectrics into this type of architecture.

A second type of known architecture concerns the so-called "superposed" cells, where the capacitor is formed after the transistor. FIG. 1 shows such a DRAM cell architecture where a capacitor 1 is formed above a transistor 2. The transistor 2 includes a gate 2g and a source and drain zone, 2s and 2d respectively. The contact between the transistor 2 and the capacitor 1 operates through a contact point of the capacitor 3. Another contact point 4 allows contact between a first bit line 5 and the transistor 2. Thus, when the gate 2g is energized, i.e. when the transistor is conducting, the current brought by the contact point 4 passes through the source and drain zones 2s and 2d and charges the capacitor.

In this architecture, when attempting to increase integration density, achieving the contact 4 to the bit line 5 becomes problematic. Indeed, the capacitor 1 must be integrated under the metallization line while retaining a separation of F relative to the contact point 4. Thus, when using photolithography to define the contacts, a minimum distance must be observed between the capacitor and the contact point.

This constraint limits the size of the cell to a minimum length in the event a surface with a sufficient capacitance is required. In the ideal case where the length of the cell is reduced to 4F, for example in FIG. 1, the contacts 3 of the capacitors must be self-aligned with the transistors. The technology using self-aligned contacts is extremely complex, difficult to control and therefore expensive.

Thus, in the "superposed" type architecture, the aspect ratio of the capacitor is still dominant. In addition, despite the use of high permittivity dielectrics, the constraints on achieving good integration density are significant. In particular, this is so regarding the margins to be observed during the photolithography for making the capacitor contact. The architecture is therefore limited by its spatial requirement. Even when the capacitor is made after the transistor and therefore not subjected to an anneal stage, the architecture allows materials with high dielectric constants, such as tantalum pentoxide, to replace silicon dioxide as the capacitor dielectric.

SUMMARY OF THE INVENTION

The object of the invention is to provide a DRAM cell architecture which remains compatible with the use of high permittivity dielectrics for the capacitor and which allows integration density, i.e. the number of cells on a given surface, to be increased or optimized while overcoming the technological problems restricting the integration of prior art architectures. To this end, the DRAM cell architecture of the invention allows a lateral development of the capacitor, thus offering a significant surface gain which restricts the aspect ratio relative to the cell size.

To do this, the invention proposes an architecture where the capacitor may be of the buried-type. Therefore, there are no alignment problems with the contacts. However, the capacitor is made after the transistor, unlike prior art architectures of this type. This characteristic thus allows high permittivity insulating materials to be integrated to form the capacitor dielectric.

The DRAM cell structure according to the invention is therefore distinguished by a capacitor formed in a trench after making the transistor and, moreover, providing lateral surface development in the silicon substrate. The particular in-trench capacitor structure therefore requires appreciably shallower in-trench lithography than the in-trench structure of the prior art to obtain the required capacitor surface.

Advantageously, the capacitor lateral development is implemented by using etch selectivity between silicon germanium (SiGe) and silicon (Si). The present invention thus implements the principle of "Silicon On Nothing" (SON) technology, developed in French Patent No. 9,903,470 to which the reader may refer for more information. This technology was developed to isolate a transistor from the substrate by an isolator, but has never been applied to forming a capacitor in a DRAM cell.

The invention therefore is directed to a process for making a DRAM cell comprising: growing silicon germanium layers and silicon layers, by epitaxy, from a silicon substrate; superposing a first N+ doped silicon layer and a second P doped silicon layer; forming a transistor on the obtained substrate, the transistor comprising a gate, a source zone, a drain zone, spacers and a hard mask to cover the gate of the transistor; etching a trench in the extension of the transistor to provide access to the silicon germanium layers; selectively etching the silicon germanium layers over a pre-set depth relative to the silicon layers to form lateral cavities; and forming a capacitor in the trench and in the lateral cavities.

BRIEF DESCRIPTION OF THE INVENTION

The characteristics and advantages of the invention will be better understood from reading the following description of an embodiment with reference to the following figures wherein.

DETAILED DESCRIPTION OF THE PREFERRED EMBODIMENTS

Figure 1:
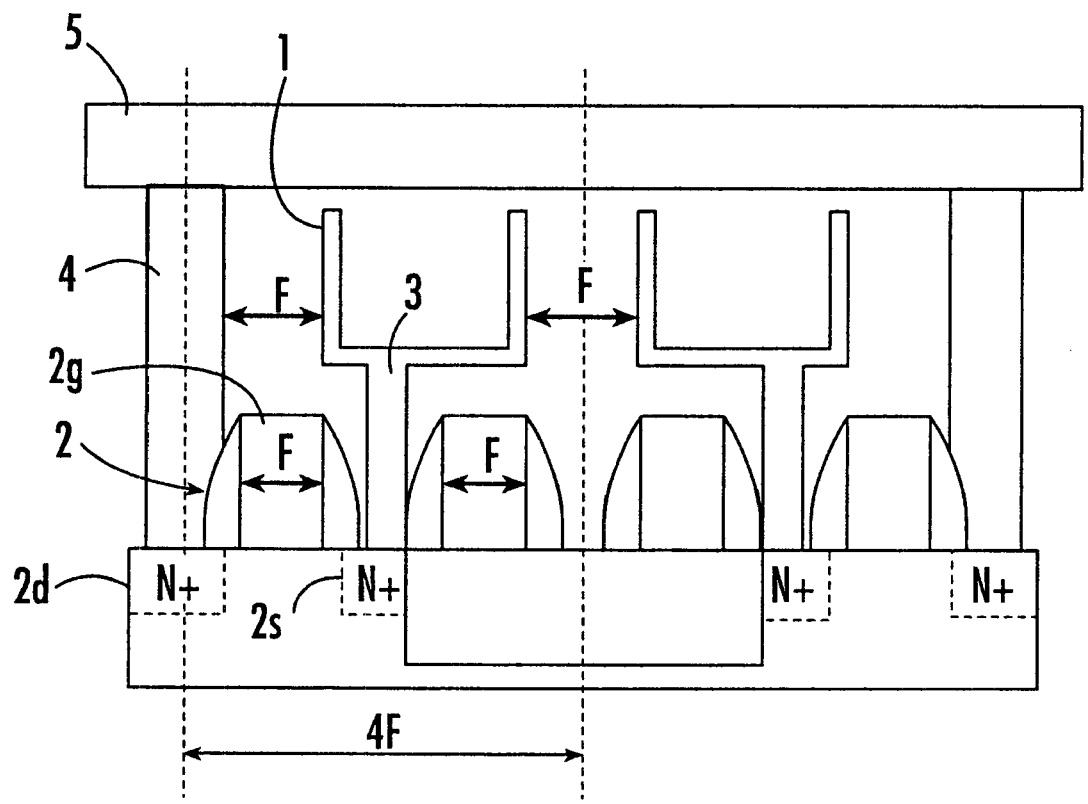
FIG. 1 is a diagram showing a so-called "superposed" DRAM cell architecture, according to the prior art.
Figure 2:
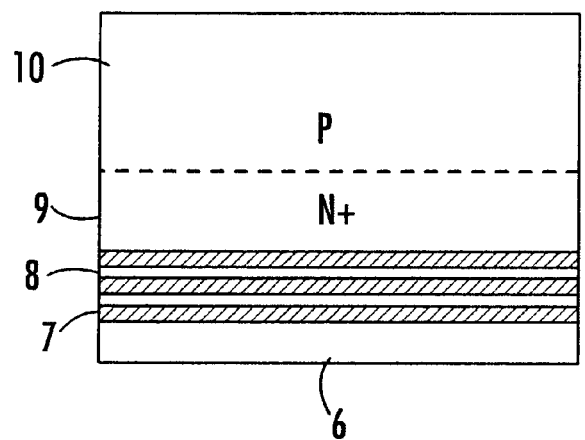
FIGS. 2 to 8 are diagrams showing the stages in the manufacturing process of a DRAM cell, according to the invention.

FIG. 2 therefore shows the beginning of the process according to the present invention. The process starts from a silicon substrate 6 on which has been grown, by epitaxy, layers of silicon germanium (SiGe) 7 and layers of silicon (Si) 8 with very tightly controlled thicknesses, for example, 30 nm (nanometers). Two thicker silicon epitaxies, doped in situ, are then carried out. For example, a first N+ type layer 9 of a thickness equal to 200 nm, and a second P-type layer 10 of a thickness equal to 400 nm are formed.

As shown in FIG. 2, the number of layers of silicon germanium (SiGe) 7 is three, but epitaxy technology makes it possible to not set limits on the number of layers. Therefore, the number of silicon germanium (SiGe) 7 layers does not restrict the scope of the invention. There is at least one silicon germanium (SiGe) layer.

Figure 3:
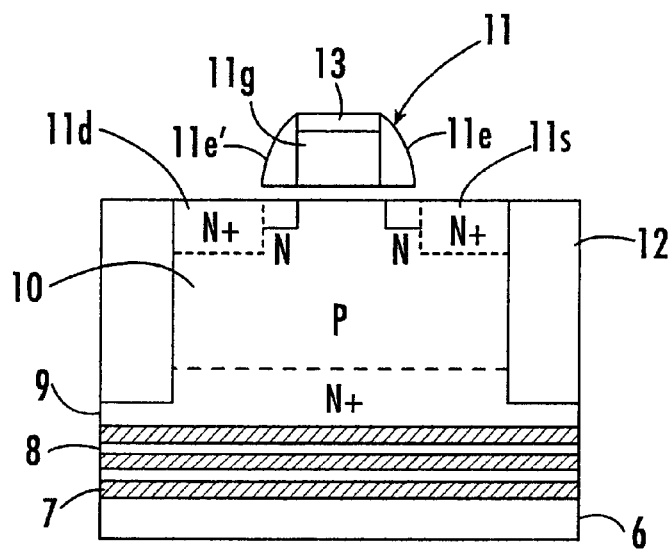

The stack of layers 6, 7, 8, 9 and 10 obtained respectively serve as a base substrate for making the transistor 11, as shown in FIG. 3. Sequencing the manufacturing stages of the transistor, which allows the structure shown in FIG. 3 to be formed, occurs conventionally. In particular, isolation trenches 12 are provided to isolate the cells from each other so that there are no stray electric effects of one transistor on its neighbor. However, the depth of the isolation trenches 12 may be restricted to 450 nm, in our example, to not penetrate into the layers of silicon germanium SiGe 7.

The transistor 11 includes a gate 11g, a source zone 11s and a drain zone 11d, made by implanting N+ type dopants in the silicon, and spacers 11e and 11e'. Surface pre-implants of N-type dopants are also provided under each respective spacer, on the source side and on the drain side, of the transistor. The respective extensions, on the source side and on the drain side, allow implanting under the transistor gate 11.

Moreover, one aspect of the invention includes depositing a hard "SON"-type mask 13 over the transistor gate. The hard mask 13 coats the gate 11g to protect it during the next stage of etching the trench. During this next stage, the capacitor is formed as referenced in FIGS. 4 and 5.

Figure 4:
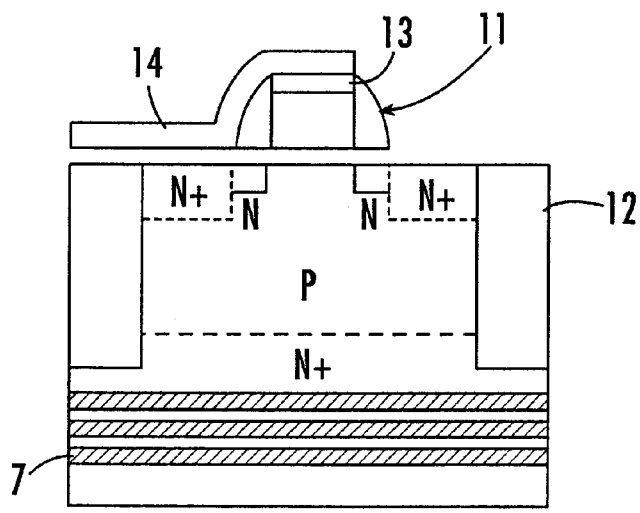

FIG. 4 shows a lithography stage for opening a window through a protection layer. This stage therefore comprises depositing a layer 14 of protective resin on the transistor 11. The layer 14 is added in addition to the hard mask 13 to increase the protection of the transistor 11 and thus make the process more effective.

Figure 5:
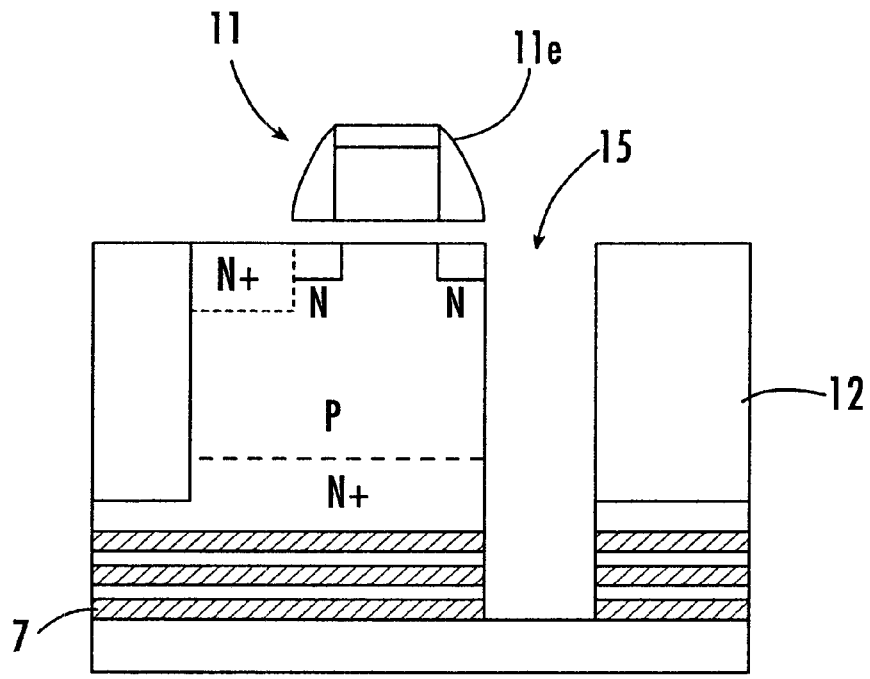

Indeed, as shown in FIG. 5, a trench-type etching is then carried out in the silicon in a self-aligned way with the spacer lie to provide an access to the buried layers of silicon germanium SiGe 7. Then, the protective resin layer 14, which protects the transistor, is removed. A shallow trench 15 is thus formed in the extension of the transistor 11 and provides an access to the layers of silicon germanium 7. The advantage of these silicon germanium layers is that processes exist for selectively etching the silicon germanium relative to the silicon.

Figure 6:
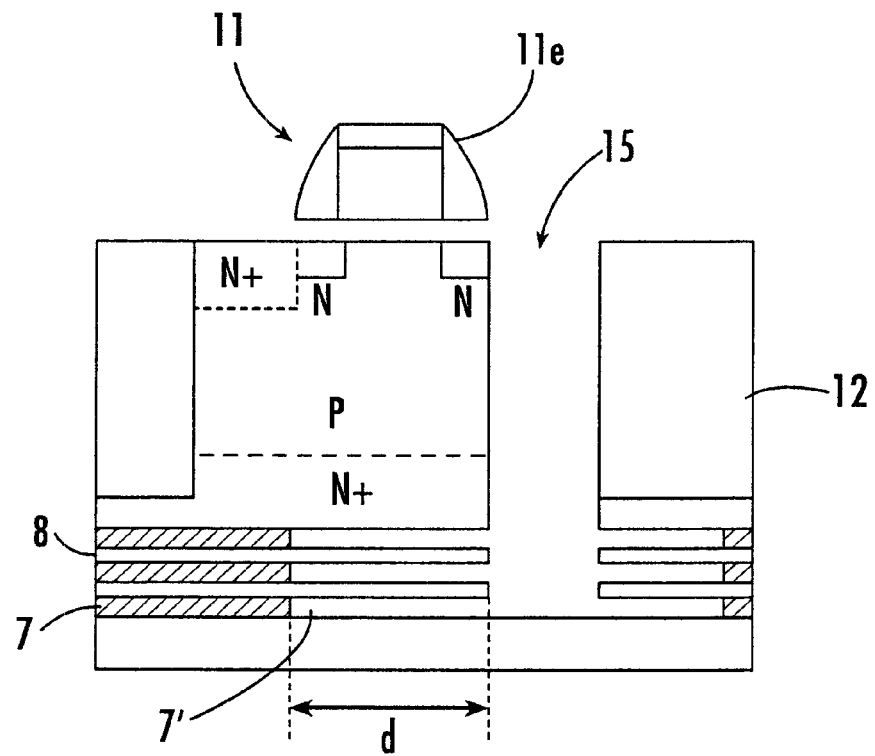

Thus, as shown in FIG. 6, a selective wet etching or isotropic plasma etching process allows the silicon germanium of the silicon germanium 7 layers to be selectively withdrawn over a pre-set depth "d", without touching the silicon layers 8. Thus, lateral cavities 7' for the capacitor are formed.

The depth "d" is controlled by the etching time of the silicon germanium selective removal process. As soon as the layers of silicon germanium 7 have been selectively etched relative to the layers of silicon, the capacitor remains to be made in the trench 15 and the lateral cavities 7'.

Figure 7:
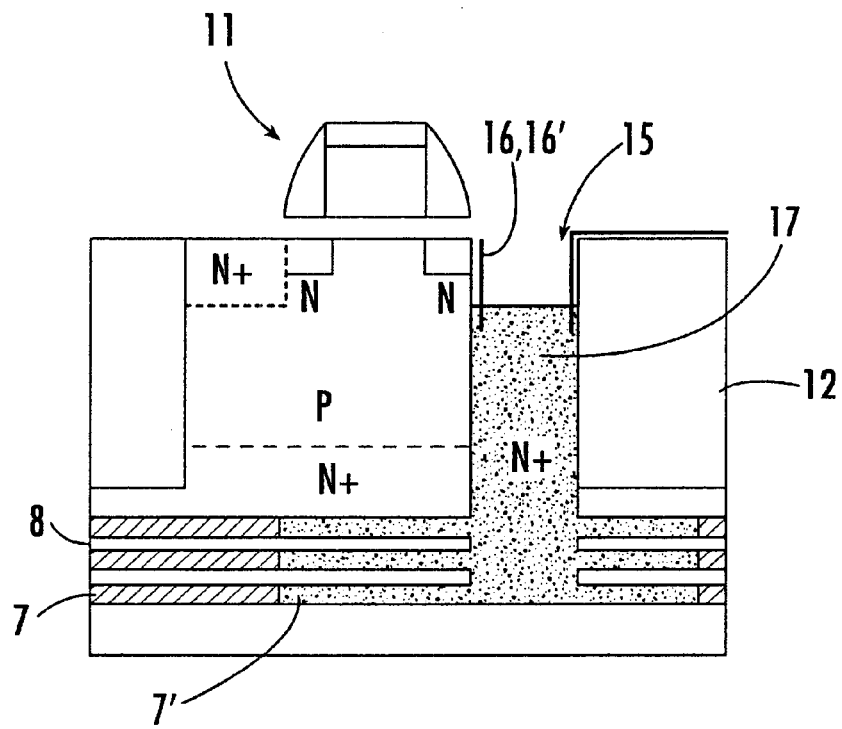
Figure 8:
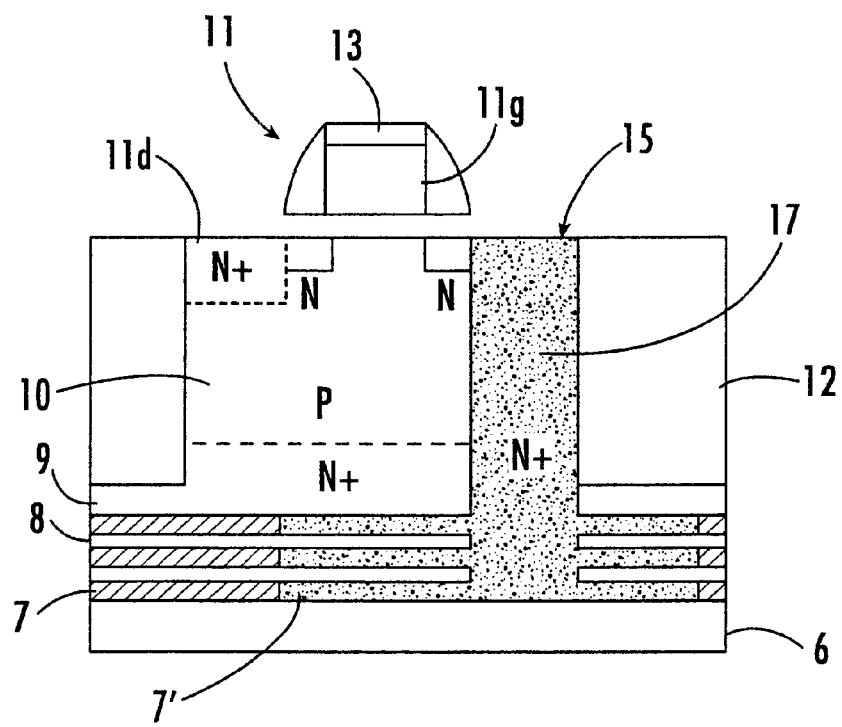

The stage of making the capacitor is shown in FIGS. 7 and 8 and includes several sub-stages. Thus, the capacitor may be conventionally made by depositing a very thin layer of oxide before filling the polysilicon. The capacitor dielectric may also be made by depositing a high permittivity dielectric, such as $Ta_2O_5$. Indeed, since the transistor is completely finished at this stage of the process, the capacitor is not subjected to thermal balance.

Thus, the deposition of the oxide 16 on the capacitor is achieved by dry oxidation. As explained above, a deposit of high permittivity dielectric 16' may also be used instead of the oxide. The oxide 16 (or the high permittivity dielectric 16') is deposited over the entire inner surface of the trench 15 and lateral cavities 7'.

Then, N+ doped polysilicon 17 is deposited into the trench 15 and fills the lateral cavities 7'. Advantageously, the polysilicon deposit is made by the epitaxy of N+ doped polysilicon "in situ" to perfectly control the height of the polysilicon in the trench 15. The height of the polysilicon is then determined by the thickness of the deposited polysilicon and by a controlled withdrawal so that the upper end of the trench 15 is not filled.

The polysilicon 17 is therefore put into the trench 15, but not right up to the top of it, as shown in FIG. 7. The next step is to withdraw the layer of isolating oxide 16 (or high permittivity dielectric) located in the upper end of the trench 15, that is not entirely filled by the polysilicon, which prevents conduction between the transistor and the capacitor. The trench 15 filling process is then completed by an epitaxy of N+ doped polysilicon which thus contacts the source side transistor extension, see FIG. 8.

The polysilicon filling is therefore completed in two phases. The first phase comprises filling the capacitor by an epitaxy of N+ doped polysilicon. Then, after cleaning the isolating oxide (or high permittivity dielectric) located in the top of the trench 15, a second phase comprises completing the filling of the upper end of the trench 15 to provide the electric contact between the transistor and the capacitor.

The DRAM cell obtained in FIG. 8 is then finished. The remaining step is to connect the drain lid to the bit line (not shown) and the gate 11g to the word line (not shown). The N+ substrate should also be connected to a DC voltage (not shown) with an external socket.

However, for the purpose of increasing the integration capacitance, it is necessary to bring the transistors closer to each other. The lateral extensions of the capacitors, as implemented by the process of the invention, may then restrict the integration capacitance. Indeed, when attempting to bring two consecutive transistors closer together to improve the integration capacity, the lateral extensions of the capacitors may touch each other.

This phenomenon therefore restricts their integration. A particular embodiment of the invention allows this phenomenon to be overcome and thus an increased on optimum lateral space to be gained by making capacitors of two consecutive memory cells on two levels in the silicon substrate to make them overlap.

Figure 9:
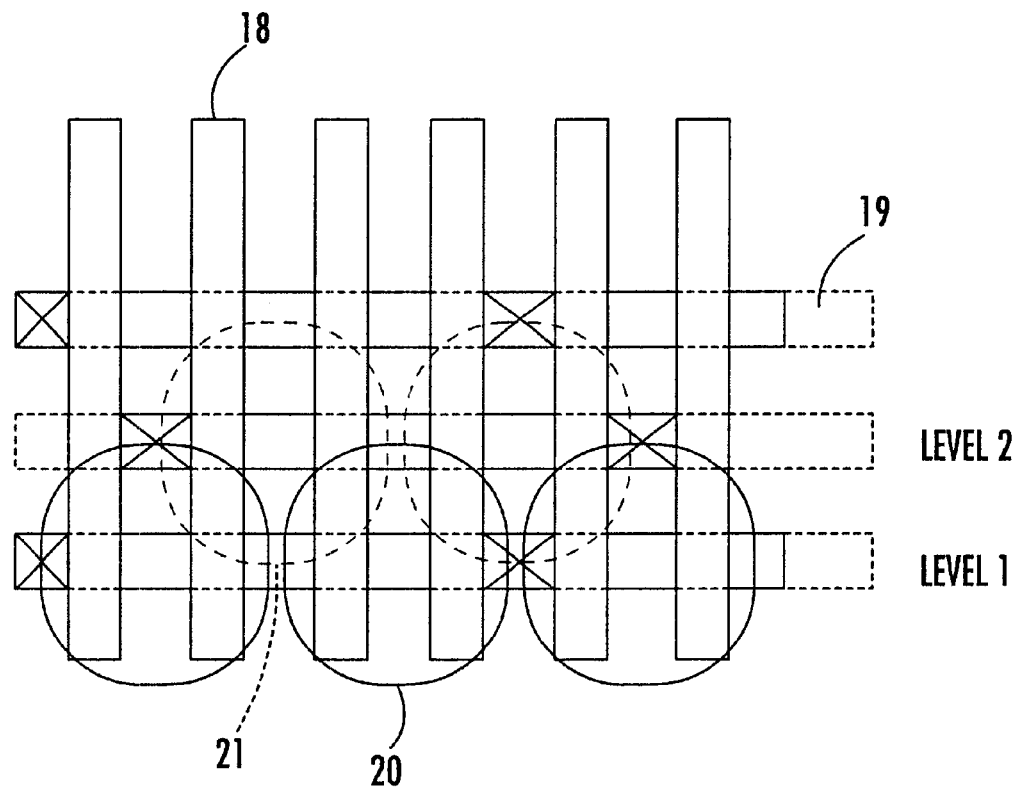
FIG. 9 shows a top view from of a DRAM cell device, according to a particular embodiment of the invention.

FIG. 9 shows a top view of a DRAM cell device with a set of word lines 18 and a set of bit lines 19, where the capacitors 20, 21 of two consecutive transistors overlap, and thus show the substantial gain in lateral space in the device. The capacitor 20 is formed at a first level 1 of the substrate and the capacitor 21 is formed at a second level 2 of the substrate, which allows them to overlap.

Figure 10:
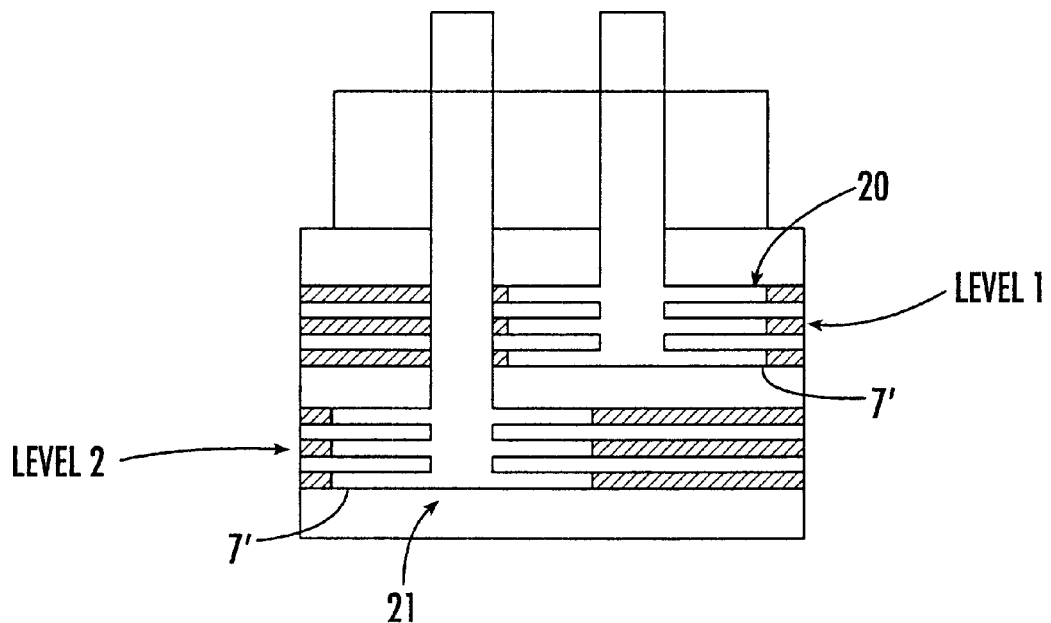
FIG. 10 shows a transverse cross-section of the device in FIG. 9.

FIG. 10 shows a transverse cross-section of the device in FIG. 9 and shows the two-level structure of two consecutive memory cells. The capacitors 20, 21 are formed by implementing the process of the present invention as explained above in the description, at an upper level 1 and at a lower level 2 of the substrate, respectively. Thus, the lateral extensions overlap.

Figure 11:
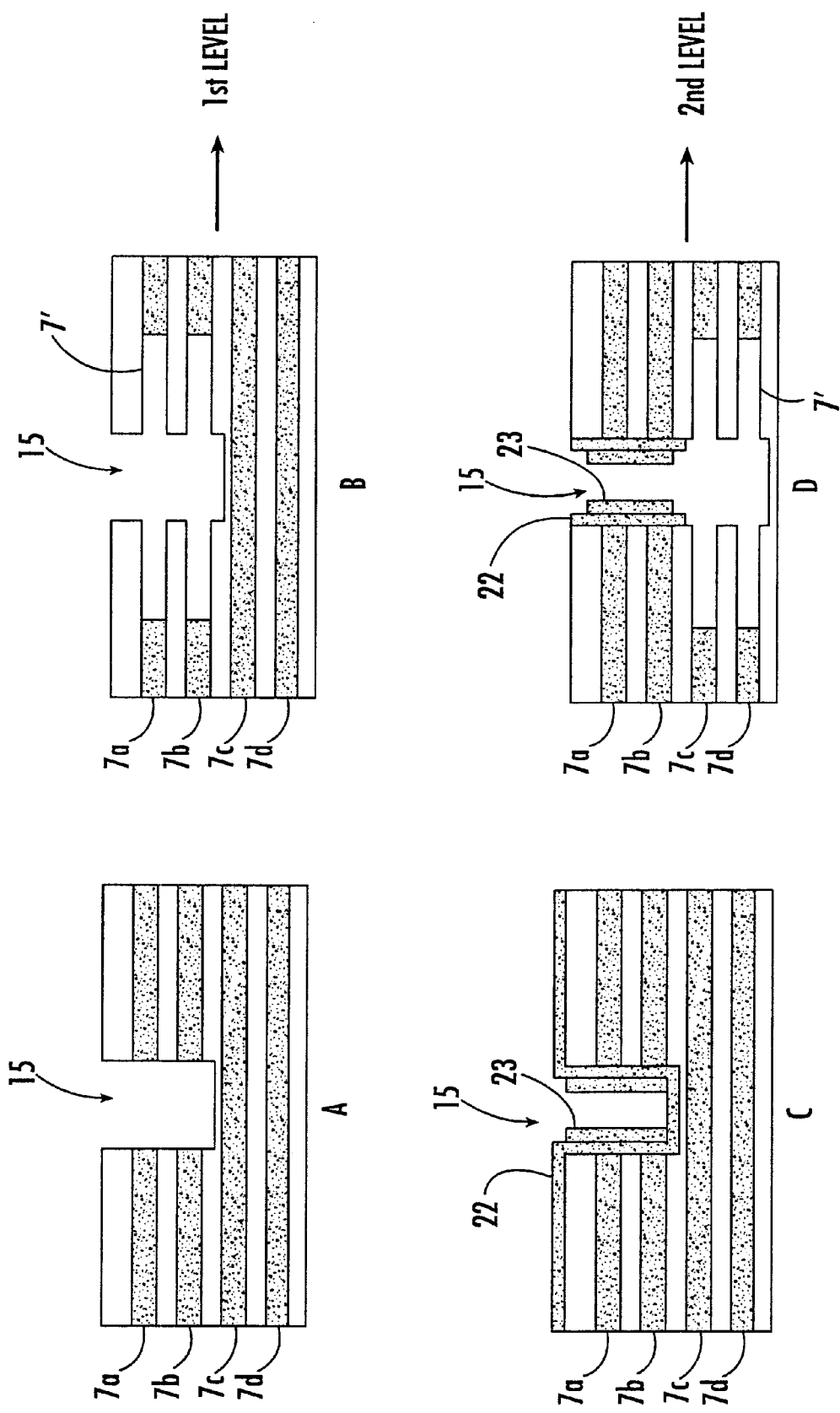
FIG. 11 shows the particular technological stages to implement the particular embodiment of the process, according to the invention.

Achieving this overlapping nonetheless requires a few particular technological stages, explicitly illustrated in FIG. 11. The diagrams in FIG. 11 are simplified because the transistor is not shown. The only purpose is to show the additional stages to be implemented in the process of the present invention, which allows overlapping of the lateral cavities of two consecutive memory cells.

In particular, the starting point is a substrate on which silicon germanium layers 7a, 7b, 7c and 7d respectively, and silicon layers have been grown by the epitaxial process. The process, according to the invention, is thus applied to a substrate comprising two levels of silicon germanium layers.

The first level of upper layers corresponds to the layers 7a, 7b of the silicon germanium. The second level of lower layers corresponds to the layers 7c, 7d of the silicon germanium. The number of layers forming the two levels can be varied and does not restrict the scope of the invention.

When the capacitor is made at the upper layer level 7a, 7b, the trench 15 is directly etched to provide an access to the upper silicon germanium layers level 7a, 7b by stopping the etching of the trench 15 in the silicon before the lower silicon germanium layers 7c, 7d of the second level, as illustrated in diagram A. The etching time corresponding to the given depth must therefore be perfectly controlled. The lateral etching of the capacitor shown in diagram B may then be carried out. This lateral etching stage has been explained above in the description with reference to FIG. 6.

To etch the second level, i.e. the lower layers 7c, 7d of the silicon germanium, selective relative to the first level, it is necessary to protect the layers 7a, 7b of silicon germanium of the first level to access the second level layers of the capacitor. Etching the second level is explained with reference to diagrams A, C, and D in FIG. 11.

Thus, after the first etching of the trench 15, which stops without the silicon before reaching the lower layers 7c, 7d of the second level, the sides of the trench 15 are protected depositing oxide 22 and by forming thin nitride spacers 23, see diagram C. With reference to diagram D, etching the trench may then resume and continue until an access passage is provided to the lower layers 7c, 7d of the silicon germanium.

A light layer of nitride remains on the sides of the trench 15 at the level of the silicon germanium layers 7a, 7b. Thus, during lateral etching of the layers 7c, 7d, the upper layers 7a, 7b of the silicon germanium are protected and are not etched by the implemented selective etching process.

The process according to the invention therefore makes it possible to form a capacitor made in a trench by laterally developing its surface in the silicon substrate. This is performed by selectively etching between the silicon germanium and the silicon. This characteristic allows a significant gain of the capacitor surface.

Moreover, implementing the process of the invention on two levels, for two consecutive transistors, allows the integration capacitance to be improved by overlapping the capacitors. Another advantage of the invention is the applicability of high permittivity dielectric materials in the capacitor.

That which is claimed is:

1. A DRAM device comprising:
   a substrate;
   a plurality of first semiconductor layers adjacent said substrate and a second semiconductor layer between adjacent first semiconductor layers, the first and second semiconductor layers being selectively etchable;
   an N+ doped layer on said first and second semiconductor layers;
   a P doped layer on said N+ doped layer;
   a plurality of transistors adjacent the first and second semiconductor layers, and formed in said P doped layer;
   a respective trench laterally adjacent each transistor;
   a plurality of lateral cavities formed in portions of the first semiconductor layers adjacent each transistor and connected in communication with a respective trench; and
   a capacitor in a respective trench and lateral cavities for each transistor and connected thereto.

2. A DRAM device according to claim 1, wherein the capacitor comprises:
   a dielectric layer on an inner surface of the trench and the lateral cavities; and
   an electrically conductive material filling the lateral cavities and the trench.

3. A DRAM device according to claim 2, wherein the dielectric layer comprises tantalum pentoxide.

4. A DRAM device according to claim 1, wherein the first and second semiconductor layers comprise first and second vertically spaced levels thereof; and wherein adjacent capacitors use alternating ones of the first and second levels.

5. A DRAM device according to claim 1, wherein each transistor comprises:

source and drain regions;

a gate extending between the source and drain regions; and spacers adjacent sides of said gate.

6. A DRAM device according to claim 1, wherein the first semiconductor layers comprise silicon germanium, and the second semicondcutor layers comprise silicon.

7. A DRAM device comprising:

a substrate;

a plurality of silicon germanium layers adjacent said substrate and a silicon layer between adjacent silicon germanium layers, the silicon germanium and silicon layers comprising first and second vertically spaced levels thereof;

an N+ doped layer on said silicon germanium and silicon layers;

a P doped layer on said N+ doped layer;

a plurality of transistors adjacent the silicon germanium and silicon layers, and formed in said P doped layer;

a respective trench laterally adjacent each transistor;

a plurality of lateral cavities formed in portions of the silicon germanium layers adjacent each transistor and connected in communication with a respective trench; and a capacitor in a respective trench and lateral cavities for each transistor and connected thereto, adjacent capacitors using alternating ones of the first and second levels.

8. A DRAM device according to claim 7, wherein the capacitor comprises:

a dielectric layer on an inner surface of the trench and the lateral cavities; and an electrically conductive material filling the lateral cavities and the trench.

9. A DRAM device according to claim 8, wherein the dielectric layer comprises tantalum pentoxide.

10. A DRAM device according to claim 1, wherein each transistor comprises:

source and drain regions;

a gate extending between the source and drain regions; and spacers adjacent sides of said gate.

* * * * *